United States Patent
Menge et al.

(10) Patent No.: US 10,442,989 B2
(45) Date of Patent: Oct. 15, 2019

(54) SCINTILLATION CRYSTAL, A RADIATION DETECTION SYSTEM INCLUDING THE SCINTILLATION CRYSTAL, AND A METHOD OF USING THE RADIATION DETECTION SYSTEM

(71) Applicant: SAINT-GOBAIN CERAMICS & PLASTICS, INC., Worcester, MA (US)

(72) Inventors: Peter R. Menge, Novelty, OH (US); Vladimir Ouspenski, Saint-Pierre-les-Nemours (FR)

(73) Assignee: SAINT-GOBAIN CERAMICS & PLASTICS, INC., Worcester, MA (US)

(*) Notice: Subject to any disclaimer, the term of this patent is extended or adjusted under 35 U.S.C. 154(b) by 0 days.

(21) Appl. No.: 16/043,374

(22) Filed: Jul. 24, 2018

(65) Prior Publication Data
US 2018/0327663 A1    Nov. 15, 2018

Related U.S. Application Data

(63) Continuation of application No. 15/710,509, filed on Sep. 20, 2017, now Pat. No. 10,053,624, which is a
(Continued)

(51) Int. Cl.
*G01T 1/202* (2006.01)
*C09K 11/77* (2006.01)
(Continued)

(52) U.S. Cl.
CPC ...... *C09K 11/7772* (2013.01); *C04B 35/5152* (2013.01); *C04B 35/553* (2013.01);
(Continued)

(58) Field of Classification Search
CPC .................. G01T 1/20; G01T 1/202
See application file for complete search history.

(56) References Cited

U.S. PATENT DOCUMENTS 4,835,398 A    5/1989   Nakamura
5,039,858 A *  8/1991   Anderson ............... G01T 1/202
                                                    250/363.03
(Continued)

FOREIGN PATENT DOCUMENTS

CN         1404522 A     3/2003
CN       103687928 A     3/2014
(Continued)

OTHER PUBLICATIONS

International Search Report for PCT/US2013/067103, dated Dec. 26, 2013, 1 page.
(Continued)

*Primary Examiner* — David P Porta
*Assistant Examiner* — Djura Malevic
(74) *Attorney, Agent, or Firm* — Abel Schillinger, LLP; Robert N. Young

(57) ABSTRACT

A scintillation crystal can include $Ln_{(1-y)}RE_yX_3$, wherein Ln represents a rare earth element, RE represents a different rare earth element, y has a value in a range of 0 to 1, and X represents a halogen. In an embodiment, RE is Ce, and the scintillation crystal is doped with Sr, Ba, or a mixture thereof at a concentration of at least approximately 0.0002 wt. %. In another embodiment, the scintillation crystal can have unexpectedly improved linearity and unexpectedly improved energy resolution properties. In a further embodiment, a radiation detection system can include the scintillation crystal, a photosensor, and an electronics device. Such a radiation detection system can be useful in a variety of radiation imaging applications.

19 Claims, 6 Drawing Sheets

Related U.S. Application Data continuation of application No. 14/966,610, filed on Dec. 11, 2015, now Pat. No. 9,796,922, which is a continuation of application No. 13/488,756, filed on Jun. 5, 2012.

(60) Provisional application No. 61/493,805, filed on Jun. 6, 2011.

(51) Int. Cl.
| | |
|---|---|
| *G21K 4/00* | (2006.01) |
| *C04B 35/515* | (2006.01) |
| *C04B 35/553* | (2006.01) |
| *C30B 11/04* | (2006.01) |
| *C30B 15/04* | (2006.01) |
| *C30B 29/12* | (2006.01) |
| *G01T 1/20* | (2006.01) |

(52) U.S. Cl.
CPC .......... *C09K 11/7773* (2013.01); *C30B 11/04* (2013.01); *C30B 15/04* (2013.01); *C30B 29/12* (2013.01); *G01T 1/202* (2013.01); *G01T 1/2018* (2013.01); *G21K 4/00* (2013.01); *C04B 2235/3206* (2013.01); *C04B 2235/3213* (2013.01); *C04B 2235/3215* (2013.01); *C04B 2235/3224* (2013.01); *C04B 2235/3227* (2013.01); *C04B 2235/3229* (2013.01); *C04B 2235/3284* (2013.01); *C04B 2235/9646* (2013.01)

(56) References Cited

U.S. PATENT DOCUMENTS

| | | | | |
|---|---|---|---|---|
| 5,168,540 | A * | 12/1992 | Winn | C23C 16/18 385/128 |
| 6,043,525 | A * | 3/2000 | Chen | H01L 27/14609 250/215 |
| 6,201,270 | B1 * | 3/2001 | Chen | H01L 27/14609 250/214.1 |
| 6,872,937 | B2 | 3/2005 | Williams et al. | |
| 7,365,333 | B1 * | 4/2008 | Shah | G01T 1/2018 250/361 R |
| 7,405,404 | B1 * | 7/2008 | Shah | C09K 11/7719 250/361 R |
| 7,479,637 | B2 | 1/2009 | Dorenbos et al. | |
| 7,608,828 | B2 * | 10/2009 | Yoshikawa | C09K 11/7719 250/361 R |
| 7,655,919 | B1 * | 2/2010 | Shah | G01T 1/202 250/370.11 |
| 7,692,153 | B2 * | 4/2010 | Shimizu | C01F 17/0056 250/361 R |
| 7,755,054 | B1 * | 7/2010 | Shah | C09K 11/7772 250/361 R |
| 7,863,572 | B1 * | 1/2011 | Doty | G01T 1/2023 250/361 R |
| 8,153,983 | B1 * | 4/2012 | Shah | G01T 1/202 250/361 R |
| 8,179,461 | B2 * | 5/2012 | Suzuki | H04N 5/3572 250/208.1 |
| 8,299,436 | B2 | 10/2012 | Srivastava et al. | |
| 8,519,339 | B2 | 8/2013 | Flamanc et al. | |
| 8,575,553 | B1 * | 11/2013 | Shah | G21K 4/00 250/361 R |
| 8,629,403 | B2 * | 1/2014 | Vyprintsev | C01F 17/0056 250/361 R |
| 8,829,445 | B1 * | 9/2014 | Nagarkar | C23C 16/30 250/362 |
| 8,957,386 | B1 * | 2/2015 | Nagarkar | C09K 11/7733 250/362 |
| 2005/0082484 | A1 | 4/2005 | Srivastava et al. | |
| 2006/0250513 | A1 * | 11/2006 | Yamamoto | H04N 5/23241 348/294 |
| 2007/0001098 | A1 * | 1/2007 | Sano | H04N 5/3532 250/208.1 |
| 2007/0001118 | A1 * | 1/2007 | Srivastava | C09K 11/7705 250/361 R |
| 2007/0210256 | A1 * | 9/2007 | Dorenbos | C01F 17/0056 250/361 R |
| 2007/0272898 | A1 | 11/2007 | Yoshikawa et al. | |
| 2008/0011953 | A1 | 1/2008 | Srivastava et al. | |
| 2008/0067391 | A1 * | 3/2008 | Shimizu | C01F 17/0056 250/361 R |
| 2008/0296503 | A1 | 12/2008 | Srivastava et al. | |
| 2009/0278052 | A1 | 11/2009 | Frank et al. | |
| 2010/0163735 | A1 * | 7/2010 | Menge | C09K 11/7704 250/361 R |
| 2010/0201856 | A1 * | 8/2010 | Hayashi | H04N 5/3452 348/296 |
| 2010/0268074 | A1 * | 10/2010 | Van Loef | A61B 6/032 600/431 |
| 2011/0017911 | A1 * | 1/2011 | Flamanc | C09K 11/02 250/361 R |
| 2011/0025871 | A1 * | 2/2011 | Yoshioka | H04N 5/35581 348/222.1 |
| 2011/0293499 | A1 * | 12/2011 | Iltis | C04B 35/5152 423/263 |
| 2012/0305778 | A1 | 12/2012 | Menge et al. | |
| 2014/0117242 | A1 | 5/2014 | Dorenbos et al. | |
| 2016/0122639 | A1 * | 5/2016 | Menge | G01T 1/202 29/428 |
| 2016/0200972 | A1 * | 7/2016 | Dorenbos | C09K 11/7772 156/242 |
| 2019/0146102 | A1 | 5/2019 | Dorenbos et al. | |

FOREIGN PATENT DOCUMENTS

| | | |
|---|---|---|
| EP | 1930394 A2 | 6/2008 |
| EP | 2308949 A1 | 4/2011 |
| JP | H05247462 A | 9/1993 |
| JP | 2008101180 A | 5/2008 |
| WO | 2005100645 A1 | 10/2005 |
| WO | 2007120441 A2 | 10/2007 |
| WO | 2011133545 A1 | 10/2011 |
| WO | 2012170390 A2 | 12/2012 |
| WO | 2014066900 A1 | 5/2014 |

OTHER PUBLICATIONS

Harrison, Mark J. et al., "Scintillation Performance of Aliovalently-Doped CeBr3". IEEE Transactions on Nuclear Science, vol. 56, No. 3, Jun. 2009, pp. 1661-1665.

Harrison, M. J. et al. "Initial Investigation of Strengthening Agents for Lanthanide Halide Scintillators." Penetrating Radiation Systems and Applications VIII, Proc. of SPIE vol. 6707, 67070B1-67070B10, (2007).

Nikl, Martin et al., "Development of novel scintillator crystals," Journal of Crystal Growth, vol. 292, dated 2006, pp. 416-421.

European Search Report for EP Application No. 12797342.8, dated Nov. 4, 2014, 1 page.

Foll, Dr. Helmut, "6.1.2 Silicon Crystal Growth and Waiter Production," Electronic Materials—Script, U. of Kiel, pp. 252-255 (2007).

Nicoara, Irina et al., "Growth and Characterization of Doped CaF2 Crystals," Modem Aspects of Bulk Crystal and Thin Film Preparation, Ed. Dr. Nikolai Kolesnikov, ISBN: 978-953-307-610-2, InTech, 2012, 27 pages.

Scheel, Hans J. et al. "Theoretical and Experimental Solutions of the Striation Problem," Crystal Growth Technology, Ed. H.J. Scheel and T. Fukuda, 2003, John Wiley & Sons, Ltd., 24 pages.

Pei, Yu et al. "Scintillation Characteristics of Rare-earth Halide (LnX3) Crystals," Journal of Synthetic Crystals, vol. 33, No. 6, Dec. 2004, pp. 1004-1010 (abstract only).

International Search Report for PCT/US2012/040855, dated Jan. 31, 2013, 1 page.

Supplementary Partial European Search Report for EP Application No. 13849213, dated Sep. 8, 2016, 1 page.

(56) References Cited

OTHER PUBLICATIONS

Alekhin, Mikhail, S. et al., "Improvement of LaBr3:5%Ce Scintillation Properties by Li+, Na+, Mg2+, Ca2+, Sr2+, and 3a2+ Co-Doping," Journal of Applied Physics, vol. 113, 2013, pp. 224904-1-224904-7.

Sze, S.M., "CZ Crystal Growth." VL SI Technology, McGraw-Hill Book Company, vol. 566, 1983, pp. 24-29.

U.S. Appl. No. 13/488,756, filed Jun. 5, 2012, Inventors: Peter R. Menge et al.

U.S. Appl. No. 14/064,981, filed Oct. 28, 2013, Inventors: Pieter Dorenbos et al.

Harrison, M.J. et al., "Aliovalent Doping of CeBr3," Proceedings of SPIE, Penetrating Radiation Systems and Applications XI, Sep. 29, 2010, pp. 78060M-1-78060M-14.

\* cited by examiner

SCINTILLATION CRYSTAL, A RADIATION DETECTION SYSTEM INCLUDING THE SCINTILLATION CRYSTAL, AND A METHOD OF USING THE RADIATION DETECTION SYSTEM

CROSS-REFERENCE TO RELATED APPLICATION

This application is a continuation of and claims priority under 35 U.S.C. § 120 to U.S. patent application Ser. No. 15/710,509, entitled "Scintillation Crystal, a Radiation Detection System Including the Scintillation Crystal, and a Method of Using the Radiation Detection System," by Menge et al, filed Sep. 20, 2017, which is a continuation of and claims priority under 35 U.S.C § 120 to U.S. patent application Ser. No. 14/966,610 entitled "Method of Forming a Scintillation Crystal Including a Rare Earth Halide," by Menge et al., filed Dec. 11, 2015, now U.S. Pat. No. 9,796,922, which is a continuation of and claims priority under 35 U.S.C. § 120 to U.S. patent application Ser. No. 13/488,756 entitled "Scintillation Crystal Including a Rare Earth Halide, and a Radiation Detection System Including the Scintillation Crystal," by Menge et al., filed Jun. 5, 2012, which is a non-provisional application that claims priority under 35 U.S.C. § 119(e) to U.S. Provisional Patent Application No. 61/493,805 entitled "Scintillation Crystal Including a Rare Earth Halide, and a Radiation Detection System Including the Scintillation Crystal," by Menge et al., filed Jun. 6, 2011, all of which are assigned to the current assignee hereof and incorporated herein by reference in their entireties.

FIELD OF THE DISCLOSURE

The present disclosure is directed to scintillation crystals including rare earth halides and radiation detection systems including such scintillation crystals.

BACKGROUND

Radiation detection systems are used in a variety of applications. For example, scintillators can be used for medical imaging and for well logging in the oil and gas industry as well for the environment monitoring, security applications, and for nuclear physics analysis and applications. Scintillation crystals used for radiation detection systems can include rare earth halides. Further improvement of scintillation crystals is desired.

BRIEF DESCRIPTION OF THE DRAWINGS

Embodiments are illustrated by way of example and are not limited in the accompanying figures.

Figure 1:
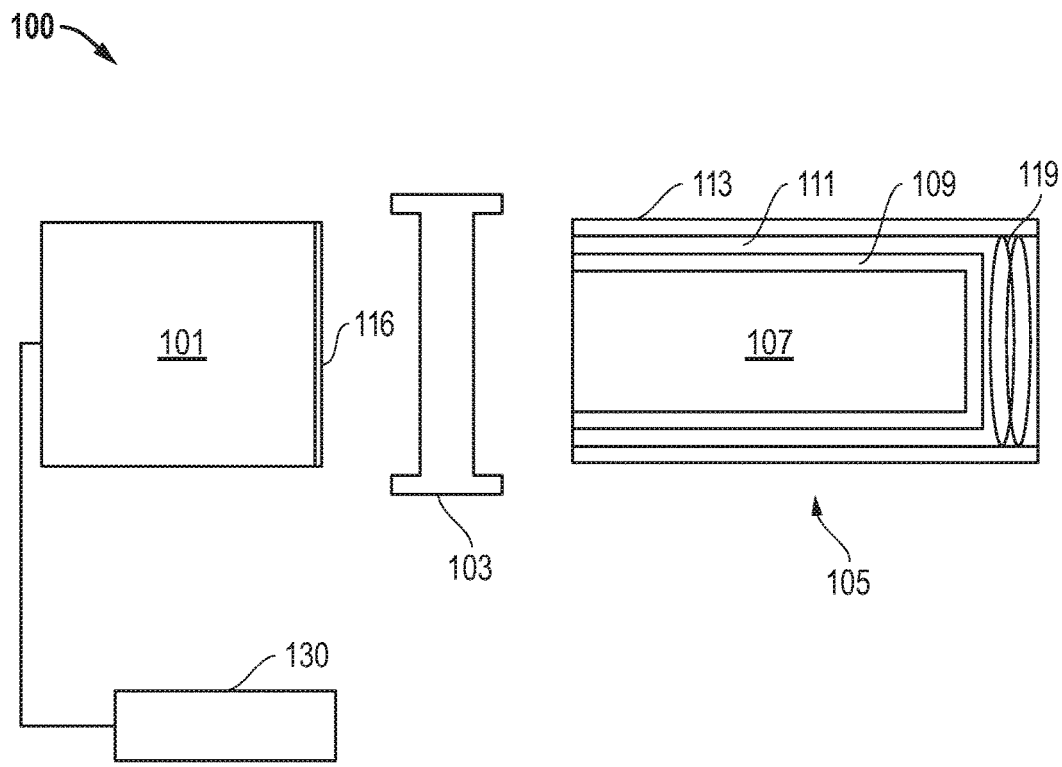
FIG. 1 includes an illustration of a radiation detection system in accordance with an embodiment.

Skilled artisans appreciate that elements in the figures are illustrated for simplicity and clarity and have not necessarily been drawn to scale. For example, the dimensions of some of the elements in the figures may be exaggerated relative to other elements to help to improve understanding of embodiments of the invention.

DETAILED DESCRIPTION

The following description in combination with the figures is provided to assist in understanding the teachings disclosed herein. The following discussion will focus on specific implementations and embodiments of the teachings. This focus is provided to assist in describing the teachings and should not be interpreted as a limitation on the scope or applicability of the teachings.

The term "averaged," when referring to a value, is intended to mean an average, a geometric mean, or a median value.

The term "corresponding undoped scintillation crystal" is intended to mean a particular scintillation crystal that includes the same halogen(s) and rare earth element(s) in substantially the same proportions as a doped scintillation crystal to which such particular scintillation crystal is being compared. For example, a doped scintillation crystal that includes a Sr-doped La1.9Ce0.1Br3 has a corresponding undoped scintillating crystal of La1.9Ce0.1Br3. Note that each of the doped and corresponding undoped scintillation crystals have trace levels of detectable impurities; however, the corresponding undoped scintillation crystal does not include a dopant that is added separately when forming the scintillation crystal.

As used herein, the terms "comprises," "comprising," "includes," "including," "has," "having," or any other variation thereof, are intended to cover a non-exclusive inclusion. For example, a process, method, article, or apparatus that comprises a list of features is not necessarily limited only to those features but may include other features not expressly listed or inherent to such process, method, article, or apparatus. Further, unless expressly stated to the contrary, "or" refers to an inclusive-or and not to an exclusive-or. For example, a condition A or B is satisfied by any one of the following: A is true (or present) and B is false (or not present), A is false (or not present) and B is true (or present), and both A and B are true (or present).

The use of "a" or "an" is employed to describe elements and components described herein. This is done merely for convenience and to give a general sense of the scope of the invention. This description should be read to include one or at least one and the singular also includes the plural, or vice versa, unless it is clear that it is meant otherwise.

Unless otherwise defined, all technical and scientific terms used herein have the same meaning as commonly understood by one of ordinary skill in the art to which this invention belongs. The materials, methods, and examples are illustrative only and not intended to be limiting. To the extent not described herein, many details regarding specific materials and processing acts are conventional and may be found in textbooks and other sources within the scintillation and radiation detection arts.

FIG. 1 illustrates an embodiment of a radiation detector system 100. The radiation detector system can be a medical imaging apparatus, a well logging apparatus, a security inspection apparatus, nuclear physics applications, or the like. In a particular embodiment, the radiation detection system can be used for gamma ray analysis, such as a Single Positron Emission Computer Tomography (SPECT) or Positron Emission Tomography (PET) analysis.

In the embodiment illustrated, the radiation detection system 100 includes a photosensor 101, an optical interface 103, and a scintillation device 105. Although the photosensor 101, the optical interface 103, and the scintillation device 105 are illustrated separate from each other, skilled artisans will appreciate that photosensor 101 and the scintillation device 105 can be coupled to the optical interface 103, with the optical interface 103 disposed between the photosensor 101 and the scintillation device 105. The scintillation device 105 and the photosensor 101 can be optically coupled to the optical interface 103 with other known coupling methods, such as the use of an optical gel or bonding agent, or directly through molecular adhesion of optically coupled elements.

The photosensor 101 may be a photomultiplier tube (PMT), a semiconductor-based photomultiplier, or a hybrid photosensor. The photosensor 101 can receive photons emitted by the scintillation device 105, via an input window 116, and produce electrical pulses based on numbers of photons that it receives. The photosensor 101 is electrically coupled to an electronics module 130. The electrical pulses can be shaped, digitized, analyzed, or any combination thereof by the electronics module 130 to provide a count of the photons received at the photosensor 101 or other information. The electronics module 130 can include an amplifier, a pre-amplifier, a discriminator, an analog-to-digital signal converter, a photon counter, another electronic component, or any combination thereof. The photosensor 101 can be housed within a tube or housing made of a material capable of protecting the photosensor 101, the electronics module 130, or a combination thereof, such as a metal, metal alloy, other material, or any combination thereof.

The scintillation device 105 includes a scintillation crystal 107. The composition of the scintillation crystal 107 will be described in more detail later in this specification. The scintillation crystal 107 is substantially surrounded by a reflector 109. In one embodiment, the reflector 109 can include polytetrafluoroethylene (PTFE), another material adapted to reflect light emitted by the scintillation crystal 107, or a combination thereof. In an illustrative embodiment, the reflector 109 can be substantially surrounded by a shock absorbing member 111. The scintillation crystal 107, the reflector 109, and the shock absorbing member 111 can be housed within a casing 113.

The scintillation device 105 includes at least one stabilization mechanism adapted to reduce relative movement between the scintillation crystal 107 and other elements of the radiation detection system 100, such as the optical interface 103, the casing 113, the shock absorbing member 111, the reflector 109, or any combination thereof. The stabilization mechanism may include a spring 119, an elastomer, another suitable stabilization mechanism, or a combination thereof. The stabilization mechanism can be adapted to apply lateral forces, horizontal forces, or a combination thereof, to the scintillation crystal 107 to stabilize its position relative to one or more other elements of the radiation detection system 100.

As illustrated, the optical interface 103 is adapted to be coupled between the photosensor 101 and the scintillation device 105. The optical interface 103 is also adapted to facilitate optical coupling between the photosensor 101 and the scintillation device 105. The optical interface 103 can include a polymer, such as a silicone rubber, that is polarized to align the reflective indices of the scintillation crystal 107 and the input window 116. In other embodiments, the optical interface 103 can include gels or colloids that include polymers and additional elements.

The scintillation crystal 107 can include a rare earth halide. As used herein, rare earth elements include Y, Sc, and the Lanthanide series elements. In an embodiment, the scintillation crystal 107 can include one or more other rare earth elements. Thus, the scintillation crystal 107 can have chemical formula as set forth below.

$Ln(1-y)RE_yX_3$, wherein:

Ln represents a rare earth element;

RE represents a different rare earth element;

y has a value in a range of 0 to 1 formula unit ("f.u."); and

X represents a halogen.

In particular embodiment, Ln can include La, Gd, Lu, or any mixture thereof; and RE can include Ce, Eu, Pr, Tb, Nd, or any mixture thereof. In a particular embodiment, the scintillation crystal 107 can be $La(1-y)Ce_yBr_3$. In particular embodiments, $LaBr_3$ and $CeBr_3$ are within the scope of compositions described.

In another a further embodiment y can be 0 f.u., at least approximately 0.0001 f.u., at least 0.001 f.u., or at least approximately 0.05 f.u. In a further embodiment, y may be 1 f.u., no greater than approximately 0.2 f.u., no greater than approximately 0.1 f.u., no greater than approximately 0.05 f.u, or no greater than approximately 0.01 f.u. In a particular embodiment, y is in a range of approximately 0.01 f.u. to approximately 0.1 f.u. X can include a single halogen or any mixture of halogens. For example, X can include Br, I, or any mixture thereof.

The rare earth halide can further include Sr, Ba, or any mixture thereof. In an embodiment, the content of Sr, Ba, or any mixture thereof in the scintillation crystal can be at least approximately 0.0002 wt. %, at least approximately 0.0005 wt. %, or at least approximately 0.001 wt. %. In another embodiment, the content of Sr, Ba, or any mixture thereof in the scintillation crystal may be no greater than approximately 0.05 wt. %, no greater than approximately 0.03 wt. %, no greater than 0.02 wt. %, or no greater than approximately 0.009 wt. %. In a particular embodiment, the content of Sr, Ba, or any mixture thereof is in a range approximately 0.005 wt. % to approximately 0.02 wt. %

The starting materials can include metal halides of the same halogen or different halogens. For example, a rare earth bromide and $SrBr_2$ can be used. In another embodiment, some of the bromide-containing compounds may be replaced with iodide-containing compounds. The starting materials may be selected such that a principal rare earth halide and another metal halide for the scintillation crystal have melting points with approximately 90° C. of each other. In a particular embodiment, melting points with approximately 50° C. of each other. For example, $LaBr_3$ has a melting point of approximately 785° C., and $SrBr_2$ has a melting point of approximately 640° C. When the melting points are closer to each other, more of the dopant may be incorporated into the scintillation crystal, if needed or desired. In another embodiment, $BaBr_2$ or any mixture of $SrBr_2$ and $BaBr_2$ can be used.

The scintillation crystal can be formed using a conventional technique from a melt. The method can include the Bridgman method or Czochralski crystal growth method.

Scintillation crystals that include a Sr-doped, Ba-doped, or Sr and Ba co-doped rare earth halide provide unexpected results as compared to other rare earth halide scintillation crystals. More particularly, the Sr-doped, Ba-doped, or Sr and Ba co-doped scintillation crystals have unusually good linearity, an unusually good energy resolution, and a lower bandgap energy.

Linearity refers to how well a scintillation crystal approaches perfect linear proportionality between gamma ray energy and light output. The linearity can be measured as a departure from perfect linearity. A scintillation crystal having perfect linearity would always create the same number of photons per unit energy absorbed, regardless of the energy of the gamma ray. Thus, its departure from perfect linearity is zero. The departure from perfect linearity between different rare earth halides is more significant at lower energies than it is for higher energies. A higher energy gamma ray (for example, greater than 2000 keV) may hit the scintillation crystal, which in turn, may generate lower energy gamma rays (for example, less than 300 keV). If the scintillation crystal generates less scintillating light for lower energy gamma rays, the scintillation crystal has poor linearity. Thus, the response of the scintillation crystal to gamma rays at lower energies, such as less than 300 keV, can be more significant to linearity than the response at higher gamma ray energies.

Departure from perfect linearity can be determined as follows. Data for responses to different gamma ray energies are collected over a range of gamma ray energies. For example, the range of gamma ray energies can be from 60 keV to 6130 keV. The range may be narrower, for example, 60 keV to 2600 keV. The lower limit on the range may be different from 60 keV. The lower limit for the range may be less than 60 keV (for example 20 keV or 40 keV) or higher than 60 keV (for example 100 or 200 keV). After reading this specification, skilled artisans will be able to select an energy range for their particular application.

After the data is collected, using a least squares fit, a linear equation is generated having an equation of:

$$E_{calc} = m * PH \qquad \text{Equation 1}$$

where:
$E_{calc}$ is the calculated energy;
PH is the pulse height (light output); and
m is the slope of the line (fit coefficient).

Note that the line passes through the point (0,0) corresponding to a pulse height of zero (no light output) when the energy is zero. Thus, there is no y-axis offset when the line corresponds to perfect linearity. For a particular gamma ray energy, the deviation from perfect linearity ("DFPL") is determined by the following equation.

$$DFPL = ((E_{calc} - E_{actual})/E_{actual}) * 100\% \qquad \text{Equation 2}$$

where $E_{actual}$ is the actual gamma ray energy corresponding to light output and $E_{calc}$ is calculated using the light output.

For a set of DFPL data points, an averaged value, a largest positive deviation, a largest negative deviation, a maximum deviation, an absolute value of any of the foregoing, or any combination thereof can be obtained. The averaged value can be an average, a median, or a geometric mean. In a particular embodiment, the average DFPL can be determined using an integral in accordance with Equation 3 below.

$$DFPL_{average} = \frac{\int_{E_{lower}}^{E_{upper}} DFPL(E_i) \cdot dE_i}{E_{upper} - E_{lower}} \qquad \text{Equation 3}$$

where
$DFPL(E_i)$ is DFPL at energy $E_i$;
$E_{upper}$ is the upper limit of the energy range; and
$E_{lower}$ is the lower limit of the energy range.

For a radiation energy range from 60 keV to 356 keV, the rare earth halide scintillator crystal can have an averaged value for a departure from perfect linearity of no less than approximately −0.35%, no less than approximately −0.30%, or no less than approximately −0.25%, no less than approximately −0.20%, or no less than approximately −0.16%. For a radiation energy range of 2000 keV to 2600 keV, the averaged value for a departure from perfect linearity may be based on absolute values because the departure from perfect linearity may cross 0.00% within the radiation energy ranges. Accordingly, for a radiation energy range of 2000 keV to 2600 keV, the rare earth scintillation crystal has an averaged value for a departure from perfect linearity, based on absolute values of no greater than approximately 0.07%, no greater than approximately 0.05%, or no greater than approximately 0.03%.

In a particular embodiment, the averaged values can be DFPLaverage (Equation 3) as described above. For a radiation energy range from 60 keV to 356 keV, the rare earth halide scintillation crystal has an absolute value for a furthest departure from perfect linearity of no greater than approximately 0.70%, no greater than approximately 0.65%, no greater than approximately 0.65% no greater than approximately 0.60% no greater than approximately 0.55%, or no greater than approximately 0.50%.

The scintillation crystal can also have unexpectedly good energy resolution properties, such as energy resolution, energy resolution ratio, and potentially other related properties. In the paragraphs below, energy resolution and energy resolution ratio are addressed in more detail.

Energy resolution is the energy range at full-width of half maximum ("FWHM") divided by the energy corresponding to the peak, expressed as a percent. A lower number for energy resolution means that the peak can be resolved more readily. Values for energy resolution may depend on the sample, the metrology equipment, and the measurement techniques. In an embodiment, measurements for energy resolution may be performed on scintillation crystals that are right circular cylinders with diameter of approximately 64 mm (2.5 inches) and length of approximately 75 mm (3 inches). In a particular embodiment, the sides and one circular face may be roughened to a root-mean-square roughness of 0.85 microns, and in another particular embodiment, the other circular face of each crystal may be polished and serve as the optical exit for scintillation light. In another embodiment, the crystals can be wrapped with a reflector on the sides and one end. In a particular embodiment, the reflector may be a specular reflector or a diffuse reflector. For example, the reflector may include an aluminum foil, aluminized polyester (e.g. aluminized Mylar™-brand polyester), or a polytetrafluoroethylene ("PTFE") sheet reflector. In another embodiment, the scintillation crystal can be placed in a housing where scintillating light passes through a sapphire or quartz window.

The housed scintillation crystal can be interfaced to a photomultiplier tube. In an embodiment, the photomultiplier tube can be a linearly focused, non-saturated photomultiplier. By non-saturated, the photomultiplier operates in a mode in which significantly more electrons may be generated with a significantly higher rate of photons striking the photocathode of the photomultiplier tube. An exemplary photomultiplier can be obtained from ET Enterprises Ltd. of Uxbridge, U.K., model 9305 run at 900 V. One or more desired isotopes can be placed one at a time at a distance of approximately 150 mm (6 inches) from each crystal package's midplane. The energy spectra of each isotope and each crystal can be obtained from a multi-channel analyzer that performs bi-polar shaping at a 0.25 micro-s shaping time. An exemplary multichannel analyzer can be obtained from Canberra Industries Inc. of Meriden Conn., model Aptec S5008 that has bi-polar shaping, 0.25 micro-s shaping time, and 11-bit digitization.

After reading this specification, skilled artisans will appreciate that the energy resolution values that they obtain may change if the sample preparation, metrology equipment, and the measurement techniques are changed. The energy resolution values described below can be obtained using the previously described sample preparation, metrology equipment, and the measurement conditions to provide a more accurate comparison of energy resolution values between different samples.

At 122 keV, the energy resolution is no greater than approximately 6.40%, no greater than approximately 6.35%, no greater than approximately 6.30%, no greater than approximately 6.20%, no greater than approximately 6.10%. In a particular embodiment, at 122 keV, the energy resolution is no greater than approximately 6.00%. At 662 keV, the energy resolution is no greater than approximately 2.90%, no greater than approximately 2.85%, no greater than approximately 2.80%, no greater than approximately 2.75%, or no greater than approximately 2.70%. In a particular embodiment, at 662 keV, the energy resolution is no greater than approximately 2.65%. At 2615 keV, the energy resolution is no greater than approximately 1.90%, no greater than approximately 1.85%, no greater than approximately 1.80%, no greater than approximately 1.75%, or no greater than approximately 1.70%. In a particular embodiment, at 2615 keV, the energy resolution is no greater than approximately 1.65%.

Energy resolution ratio ("ER Ratio") may be used to compare the energy resolutions of different compositions of materials for a particular energy or range of energies. ER Ratio can allow for a better comparison as opposed to energy resolution because ER Ratios can be obtained using substantially the same crystal size and metrology equipment and techniques. Thus, variations based on sample size and metrology equipment and techniques can be substantially eliminated.

In an embodiment, the ER Ratio is the energy resolution of a particular crystal at a particular energy or range of energies divided by the energy resolution of another crystal at substantially the same energy or range of energies, wherein the crystals have approximately the same size, and the energy spectra for the crystals are obtained using the same or substantially identical metrology equipment and techniques. When comparing a particular scintillation crystal having a composition described herein to a different scintillation crystal having a different composition, the ER Ratio is unexpected lower, which allows for more accurate detection of energy peaks. When comparing the scintillation crystals for particular energy ranges, the ER Ratio may be no greater than approximately 0.970 for energies in a range of 60 keV to 729 keV, no greater than approximately 0.950 for energies in a range of 122 keV to 2615 keV, no greater than approximately 0.920 for energies in a range of 583 keV to 2615 keV, no greater than approximately 0.900 for energies in a range of 662 keV to 2615 keV, or any combination thereof. When comparing the scintillation crystals for particular energies, the ER Ratio may be no greater than approximately 0.985 for an energy of 60 keV, no greater than approximately 0.980 for an energy of 122 keV, no greater than approximately 0.980 for an energy of 239 keV, no greater than approximately 0.970 for an energy of 511 keV, no greater than approximately 0.970 for an energy of 583 keV, no greater than approximately 0.970 for an energy of 662 keV, no greater than approximately 0.970 for an energy of 729 keV, or no greater than approximately 0.950 for an energy of 2615 keV, or any combination thereof.

ER Ratios can be obtained for Sr-doped, Ba-doped, Mg-doped, Zn-doped, and undoped $Ln(1-y)REyX3$ scintillation crystals. The ER Ratios for Sr-doped and Zn-doped scintillation crystals (Sr/Zn) and for Sr-doped and undoped scintillation crystals (Sr/undoped) can meet any or all of the ER Ratio values for the particular energies and energy ranges previously described. The ER Ratios for the Zn-doped and standard scintillation crystals (Zn/undoped) do not meet any of the previously described ER Ratio values for the particular energies and energy ranges. Although each of the Mg-doped and Zn-doped scintillation crystals has an ER Ratio less than one, when compared to the undoped scintillation crystal, the ER Ratio is just slightly less than 1. Thus, the Mg-doped and Zn-doped scintillation crystals have only an insignificant improvement regarding improved energy resolution as compared to the undoped scintillation crystal.

The scintillation crystal can have a fluorescent peak at a wavelength that is at least approximately 20 nm greater than a wavelength corresponding to a fluorescent peak of a corresponding undoped scintillation crystal. In an embodiment, the Sr-doped, Ba-doped, or Sr and Ba co-doped scintillation crystal has a fluorescent peak at a wavelength that is a range of approximately 25 nm to approximately 50 nm greater than a wavelength corresponding to the fluorescent peak of the corresponding undoped scintillation crystal. In a particular embodiment, the Sr-doped, Ba-doped, or Sr and Ba co-doped scintillation crystals can have a fluorescent peak at a wavelength in a range of approximately 375 nm to approximately 380 nm, as compared to a corresponding undoped scintillation crystal (that is, a scintillation crystal consisting essentially of the same halogen(s) and rare earth element(s) as the Sr-doped, Ba-doped, or Sr and Ba co-doped scintillation crystal) that has a fluorescent peak at a wavelength in a range of approximately 355 nm to approximately 360 nm. A photosensor may be more sensitive to blue light or green light, and thus, such a photosensor can have a higher quantum efficiency for the Sr-doped, Ba-doped, or Sr and Ba co-doped scintillation crystal as compared to the undoped scintillation crystal.

The scintillation crystal can have an energy bandgap that is at least approximately 0.05 eV less than a bandgap energy of a corresponding undoped scintillation crystal. In an embodiment, the scintillation crystal can have an energy bandgap that is at least approximately 0.10 eV, at least approximately 0.15 eV, or at least 0.20 eV less than the bandgap energy of the corresponding undoped scintillation crystal. In a particular embodiment, the Sr-doped scintillation crystal has a bandgap energy of in a range of approximately 3.26 eV to approximately 3.31 eV, and the corresponding undoped scintillation crystal has a bandgap energy of in a range of approximately 3.44 eV to approximately 3.49 eV. A scintillation crystal with a lower bandgap energy allows more scintillating light to be produced as compared to a scintillation crystal with higher bandgap energy for gamma rays of the same energy.

Many different aspects and embodiments are possible. Some of those aspects and embodiments are described herein. After reading this specification, skilled artisans will appreciate that those aspects and embodiments are only illustrative and do not limit the scope of the present invention. Additionally, those skilled in the art will understand that some embodiments that include analog circuits can be similarly implemented using digital circuits, and vice versa.

In a first aspect, a scintillation crystal can include Ln(1−y)REyX3:Me2+, wherein Ln represents a rare earth element, Me2+ represents Sr, Ba, or any mixture thereof has a concentration of at least approximately 0.0002 wt. %, RE represents a different rare earth element, y has a value in a range of 0 to 1, and X represents a halogen.

In a second aspect, a radiation detection system can include a scintillation crystal including Ln(1−y)REyX3:Me+2, wherein Ln represents a rare earth element, Me+2 represents Sr, Ba, or any mixture thereof and has a concentration of at least approximately 0.0002 wt. %, RE represents a different rare earth element, y has a value in a range of 0 to 1, and X represents a halogen. The radiation detection system can further include a photosensor optically coupled to the scintillation crystal.

a scintillation crystal can include Ln(1−y)REyX3:Me2+, wherein Ln represents a rare earth element, RE represents a different rare earth element, y has a value in a range of 0 to 1, X represents a halogen, and Sr has a concentration of at least approximately 0.0002 wt. %.

In a second aspect, a radiation detection system can include a scintillation crystal and a photosensor optically coupled to the scintillation crystal. The scintillation crystal can include Ln(1−y)REyX3:Sr, wherein Ln represents a rare earth element; RE represents a different rare earth element; y has a value in a range of 0 to 1; X represents a halogen; and Sr has a concentration of at least approximately 0.0002 wt. %.

In a third aspect, a scintillation crystal can include Ln(1−y)REyX3, wherein Ln represents a rare earth element, RE represents a different rare earth element, y has a value in a range of 0 to 1, and X represents a halogen. The scintillation crystal can have a property including, for a radiation energy range of 60 keV to 356 keV, the scintillation crystal has an averaged value for a departure from perfect linearity of no less than approximately −0.35%; for a radiation energy range of 2000 keV to 2600 keV, the scintillation crystal has an averaged value for a departure from perfect linearity of no less than approximately 0.07%; for a radiation energy range of 60 keV to 356 keV, the scintillation crystal has an absolute value for a furthest departure from perfect linearity of no greater than approximately 0.7%; an energy resolution of no greater than approximately 6.35% at 122 keV; an energy resolution of no greater than approximately 2.90% at 662 keV; an energy resolution of no greater than approximately 1.90% at 2615 keV; or any combination thereof.

In a fourth aspect, a scintillation crystal can include Ln(1−y)REyX3, wherein, Ln represents a rare earth element, RE represents a different rare earth element, y has a value in a range of 0 to 1, and X represents a halogen. An energy resolution ratio is an energy resolution of the scintillation crystal divided by a different energy resolution of a different scintillation crystal having a different composition. The energy resolution ratio can be no greater than approximately 0.970 for energies in a range of 60 to 729 keV, no greater than approximately 0.950 for energies in a range of 122 keV to 2615 keV, no greater than approximately 0.920 for energies in a range of 583 keV to 2615 keV, no greater than approximately 0.900 for energies in a range of 662 keV to 2615 keV, no greater than approximately 0.985 for an energy of 60 keV, no greater than approximately 0.980 for an energy of 122 keV, no greater than approximately 0.980 for an energy of 239 keV, no greater than approximately 0.970 for an energy of 511 keV, no greater than approximately 0.970 for an energy of 583 keV. no greater than approximately 0.970 for an energy of 662 keV, or no greater than approximately 0.970 for an energy of 729 keV, no greater than approximately 0.950 for an energy of 2615 keV, or any combination thereof.

In a particular embodiment of any of the foregoing aspects and embodiments, the scintillation crystal has an energy resolution ratio of no greater than approximately 0.985, no greater than approximately 0.975, or no greater than approximately 0.965 for an energy of 60 keV; no greater than approximately 0.980, no greater than approximately 0.950, or no greater than approximately 0.920 for an energy of 122 keV; no greater than approximately 0.990, no greater than approximately 0.960, or no greater than approximately 0.940 for an energy of 239 keV; no greater than approximately 0.970, no greater than approximately 0.930, or no greater than approximately 0.900 for an energy of 511 keV; no greater than approximately 0.980, no greater than approximately 0.940, or no greater than approximately 0.920 for an energy of 583 keV; no greater than approximately 0.970, no greater than approximately 0.910, or no greater than approximately 0.880 for an energy of 662 keV; no greater than approximately 0.970, no greater than approximately 0.910, or no greater than approximately 0.880 for an energy of 729 keV; no greater than approximately 0.950, no greater than approximately 0.850, or no greater than approximately 0.810 for an energy of 2615 keV; or any combination thereof.

In another particular embodiment of any of the foregoing aspects and embodiments, an energy resolution for the scintillation crystal can determined from an energy spectrum obtained using the scintillation crystal, a photomultiplier tube, a window disposed between the scintillation crystal and the photomultiplier tube, and a multi-channel analyzer coupled to the photomultiplier tube. Further, the scintillation crystal has a shape of a right circular cylinder with diameter of approximately 64 mm and length of approximately 75 mm, and the scintillation crystal is wrapped with a reflector on the sides and one end, the window includes sapphire or quartz, the photomultiplier tube includes a linearly focused, non-saturated photomultiplier, and the multi-channel analyzer is configured to perform bi-polar shaping at a 0.25 micro-s shaping time. In a more particular embodiment, the energy resolution is no greater than approximately 6.40% at 122 keV, no greater than approximately 2.90% at 662 keV, no greater than approximately 1.90% at 2615 keV, or any combination thereof.

In a more particular embodiment, the energy resolution is no greater than approximately 6.40%, no greater than approximately 6.30%, or no greater than approximately 6.20%, no greater than approximately 6.10%, or no greater than approximately 6.00% at 122 keV. In another more particular embodiment, the energy resolution is no greater than approximately 2.90%, no greater than approximately 2.85%, no greater than approximately 2.80%, no greater than approximately 2.75%, no greater than approximately 2.70% at 662 keV, or no greater than approximately 2.65% at 662 keV. In a further more particular embodiment, the energy resolution is no greater than approximately 1.90%, no greater than approximately 1.85%, no greater than approximately 1.80%, no greater than approximately 1.75%, no greater than approximately 1.70% at 2615 keV, or no greater than approximately 1.65% at 2615 keV.

In an embodiment of the first aspect, the scintillation crystal has a property including, for a radiation energy range of 60 keV to 356 keV, the scintillation crystal has an averaged value for a departure from perfect linearity of no less than approximately −0.35%; for a radiation energy range of 2000 keV to 2600 keV, the scintillation crystal has an averaged value for a departure from perfect linearity, based on absolute values, of no less than approximately 0.07%; or for a radiation energy range of 60 keV to 356 keV, the scintillation crystal has an absolute value for a furthest departure from perfect linearity of no greater than approximately 0.7%; an energy resolution of no greater than approximately 6.35% at 122 keV; an energy resolution of no greater than approximately 2.90% at 662 keV; an energy resolution of no greater than approximately 1.90% at 2615 keV; or any combination thereof.

In an embodiment of the second aspect, wherein the scintillation crystal has a property including, for a radiation energy range of 60 keV to 356 keV, the scintillation crystal has an averaged value for a departure from perfect linearity of no less than approximately −0.35%; for a radiation energy range of 2000 keV to 2600 keV, the scintillation crystal has an averaged value for a departure from perfect linearity, based on absolute values, of no less than approximately 0.07%; for a radiation energy range of 60 keV to 356 keV, the scintillation crystal has an absolute value for a furthest departure from perfect linearity of no greater than approximately 0.7%; an energy resolution of no greater than approximately 6.35% at 122 keV; an energy resolution of no greater than approximately 2.90% at 662 keV; an energy resolution of no greater than approximately 1.90% at 2615 keV; or any combination thereof.

In a further particular embodiment of any of the foregoing aspects and embodiments, the radiation detection system is a medical imaging system. In another further particular embodiment, the scintillation crystal is doped with Sr. In a more particular embodiment, the Sr content in the scintillation crystal is at least approximately 0.0002 wt. %, at least approximately 0.0005 wt. %, or at least approximately 0.001 wt. %, and in another more particular embodiment, the Sr content in the scintillation crystal is no greater than approximately 0.05 wt. %, no greater than approximately 0.03 wt. %, no greater than 0.02 wt. %, or no greater than approximately 0.009 wt. %.

In another particular embodiment of any of the foregoing aspects and embodiments, for a radiation energy range of 60 keV to 356 keV, the scintillation crystal has the averaged value for the departure from perfect linearity is no less than approximately −0.35%, no less than approximately −0.30%, or no less than approximately −0.25%, no less than approximately −0.20%, or no less than approximately −0.16%. In another particular embodiment, for a radiation energy range of 2000 keV to 2600 keV, the scintillation crystal has the averaged value for the departure from perfect linearity, based on absolute values, is no greater than approximately 0.07%, no greater than no greater than approximately 0.05%, or no greater than approximately 0.03%.

In a more particular embodiment, the averaged value for the departure from perfect linearity is determined by:

$$DFPLaverage = \frac{\int_{E_{lower}}^{E_{upper}} DFPL(E_i) \cdot dE_i}{E_{upper} - E_{lower}}$$

where $DFPL(E_i)$ is DFPL at energy $E_i$;

$E_{upper}$ is the upper limit of the energy range; and $E_{lower}$ is the lower limit of the energy range.

In yet another particular embodiment, for a radiation energy range of 60 keV to 356 keV, the scintillation crystal has an absolute value for a furthest departure from perfect linearity of no greater than approximately 0.70%, no greater than approximately 0.65%, or no greater than approximately 0.60%, or no greater than approximately 0.55%, or no greater than approximately 0.50%.

In another particular embodiment of any of the foregoing aspects and embodiments, Ln includes La, Gd, Lu, or any combination thereof. In still another particular embodiment, RE includes Ce, Eu, Pr, Tb, Nd, or any combination thereof. In yet another particular embodiment, y is no greater than approximately 0.5, no greater than approximately 0.2, or no greater than approximately 0.09. In a further particular embodiment, y is at least approximately 0.005, at least approximately 0.01, or at least approximately 0.02. In yet a further embodiment, Ln is La, RE is Ce, and X is Br. In a particular embodiment y is 0.2 f.u.

In another particular embodiment of any of the foregoing aspects and embodiments, the scintillation crystal is capable of emitting a first fluorescent peak at a first wavelength and a second fluorescent peak at a second wavelength, wherein the second wavelength is at least approximately 15 nm greater than the first wavelength. In a more particular embodiment, the second wavelength is a range of approximately 20 nm to approximately 40 nm greater than the first wavelength. In a further particular embodiment, the scintillation crystal has an energy bandgap that is at least approximately 0.05 eV, at least approximately 0.10 eV, at least approximately 0.15 eV, or at least 0.20 eV less than a bandgap energy of a corresponding undoped scintillation crystal.

EXAMPLES

The concepts described herein will be further described in the Examples, which do not limit the scope of the invention described in the claims. The Examples demonstrate performance of scintillation crystals of different compositions. Numerical values as disclosed in this Examples section may be approximated or rounded off for convenience.

Scintillator crystals were formed from an open crucible using LaBr3, CeBr3, and if doped, SrBr2, BaBr2, MgBr2, or ZnBr2. Because ZnBr2 sublimes at approximately at approximately 700° C. at the approximately atmospheric pressure, incorporating the Zn into the crystal was difficult as the molten composition for the scintillating crystal was maintained at a temperature above the sublimation point of ZnBr2 during the slow growth stage of the REBr3 crystal, in order to form the scintillation crystal without too many crystal defects. The scintillation crystals had the following compositions as set forth in Table 1.

TABLE 1

| Parameter or Element | Sr-doped $La_{(1-y)}Ce_yBr_3$ (%) | Zn-doped $La_{(1-y)}Ce_yBr_3$ (%) | Ba-doped $La_{(1-y)}Ce_yBr_3$ (%) | Mg-doped $La_{(1-y)}Ce_yBr_3$ (%) | Standard (Undoped) $La_{(1-y)}Ce_yBr_3$ (%) |
|---|---|---|---|---|---|
| y (f.u.) | 0.05 | 0.05 | 0.05 | 0.05 | 0.05 |
| Sr (wt. %) | 0.016 | — | — | — | — |
| Zn (wt. %) | — | 0.004 | — | — | — |
| Ba (wt. %) | — | — | 0.025 | — | — |
| Mg (wt. %) | — | — | — | 0.005 | — |

The scintillation crystals were analyzed for linearity, energy resolution, and band gap energy. Linearity and energy resolution were obtained in part from energy spectral data. The scintillation crystals were right circular cylinders with diameter of approximately 64 mm (2.5 inches) and length of approximately 75 mm (3 inches). The sides and one circular face were roughened to enhance collection of the scintillation light. The surfaces were characterized to a root-mean-square roughness of 0.85 microns. The other circular face of each crystal was polished and served as the optical exit for scintillation light. The crystals were then wrapped with approximately 0.5 mm (0.02 inches) of Teflon sheet reflector on the sides and one end. The optical exit was interfaced to an approximate 1.5 mm (0.06 inch) thickness of transparent silicone rubber. The wrapped and interfaced crystal was inserted into a titanium housing with a sapphire window. The housing was welded closed and was hermetic. This crystal package was interfaced to a photomultiplier tube (ET Enterprises Ltd. of Uxbridge, U.K., model 9305 run at 900 V). The crystals response to several gamma ray emitting isotopes was measured. These isotopes included 241Am, 133Ba, 57Co, 137Cs, and 228Th, which produce gamma ray photopeaks at 60, 81, 122, 239, 356, 662, 583, 727, 861, 2104, and 2615 keV. The isotopes were placed one at a time at a distance of approximately 150 mm (6 inches) from each crystal package's midplane. The energy spectra of each isotope and each crystal was taken using a multi-channel analyzer (Canberra Industries Inc. of Meriden Conn., model Aptec S5008, bi-polar shaping, 0.25 micro-s shaping time, 11-bit digitization).

Figure 2:
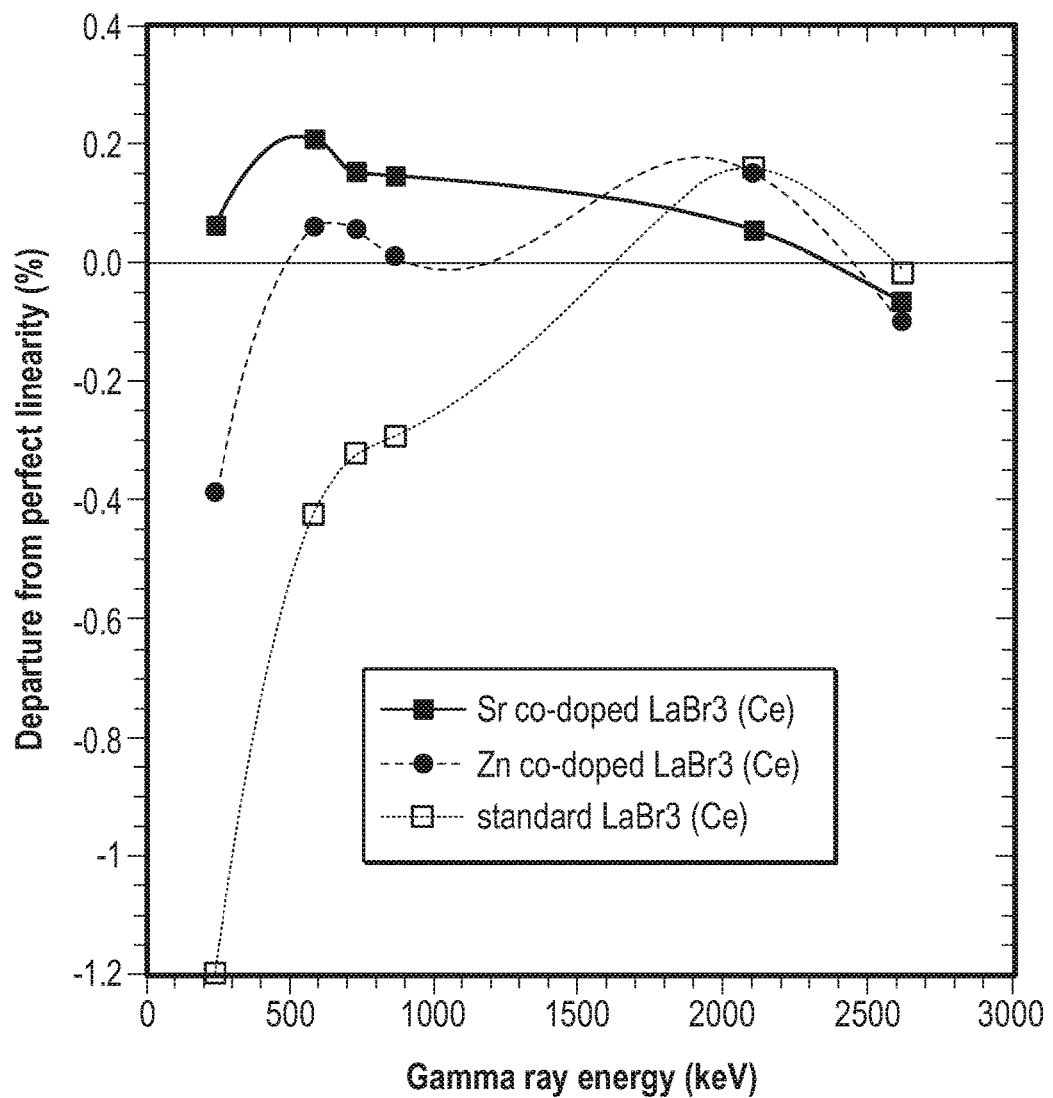
FIG. 2 includes an illustration of departure from perfect linearity for different compositions of scintillation crystals at gamma ray energies in a range of approximately 200 keV to approximately 2600 keV.
Figure 3:
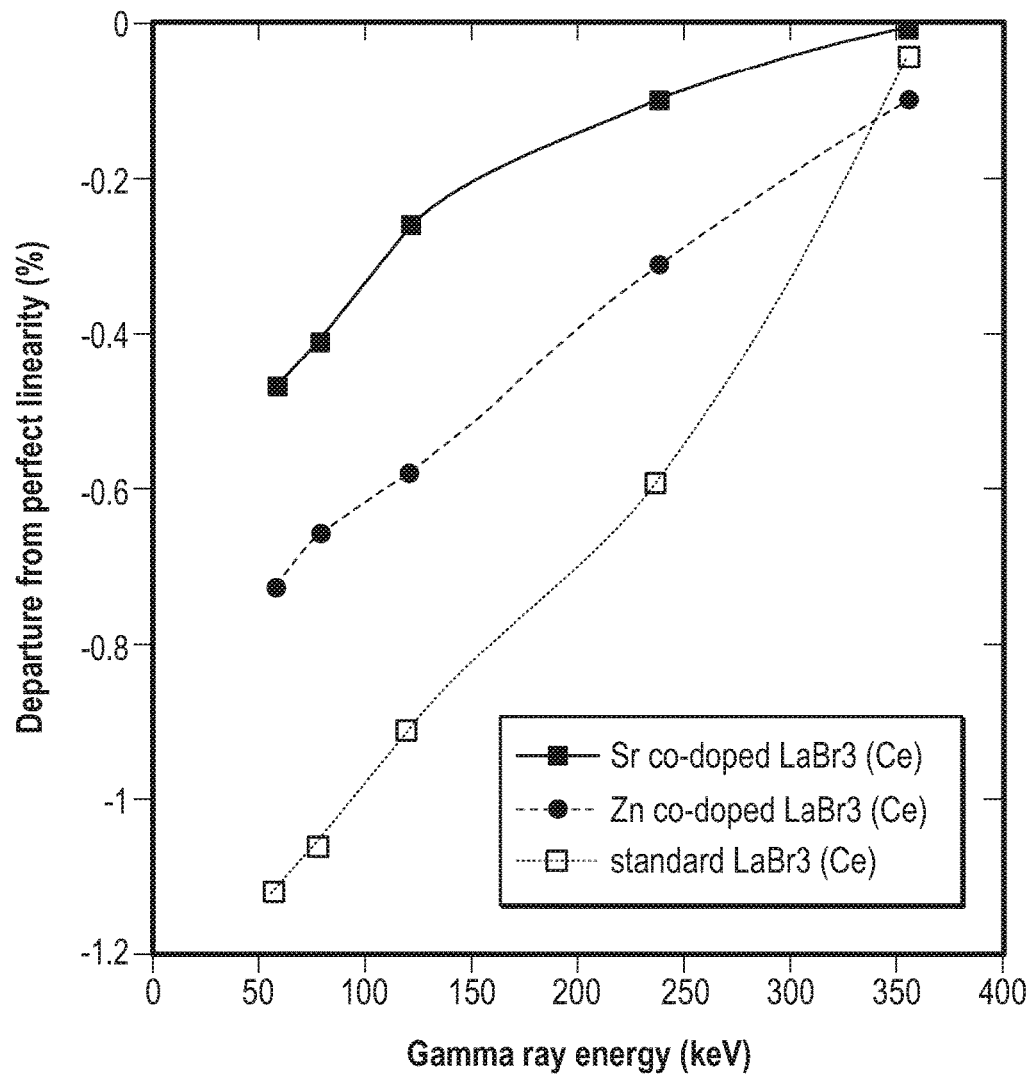
FIG. 3 includes an illustration of departure from perfect linearity for different compositions of scintillation crystals at gamma ray energies in a range of approximately 60 keV to approximately 356 keV.

FIGS. 2 and 3 include plots of departures from perfect linearity as a function of gamma ray energy for the scintillation crystals having compositions described in Table 1. The DPFL values are determined using the methodology previously described. The Sr-doped scintillation crystal has significantly less departure from perfect linearity as compared to the Zn-doped and standard scintillation crystals.

FIG. 2 illustrates the departure from perfect linearity for gamma ray energies in a range of approximately 200 keV to approximately 2600 keV. At energies greater than 2000 keV, the Sr-doped scintillation crystal has a lower DFPLaverage as compared to each of the Zn-doped and standard scintillation crystals. For the energy range from approximately 2000 keV to approximately 2600 keV, the standard scintillation crystal has a DFPLaverage of +0.091%, and the Zn-doped scintillation crystal has a DFPLaverage of +0.073%. For the same energy range, the Sr-doped scintillation crystal has the lowest DFPLaverage of +0.030%, and therefore, the Sr-doped scintillation crystal is significantly better than the standard and Zn-doped scintillation crystals for the gamma ray energies of 2000 keV to 2600 keV.

Below 1500 keV, the standard scintillation crystal has a departure from perfect linearity that becomes significantly worse as the gamma ray energies become smaller. The Zn-doped scintillation crystal likewise has a significant departure but the significant departure occurs at approximately 300 keV. For particular gamma ray energies no greater than approximately 356 keV, the Sr-doped scintillation crystal has a departure from perfect linearity that is significantly closer to zero as compared to the Zn-doped and standard scintillation crystals.

As previously discussed, the departure from perfect linearity is more significant at lower gamma ray energies because higher energy gamma rays can collide with the scintillator crystal and result in lower energy gamma rays. FIG. 3 includes data collected for the scintillation crystals when exposed to gamma ray energies in a range of approximately 60 keV to approximately 356 keV. The DFPLaverage is determined using Equation 3.

TABLE 2

| Energy (keV) | Sr-doped $La_{(1-y)}Ce_yBr_3$ (%) | Zn-doped $La_{(1-y)}Ce_yBr_3$ (%) | Standard (Undoped) $La_{(1-y)}Ce_yBr_3$ (%) |
|---|---|---|---|
| 60 | −0.47 | −0.73 | −1.11 |
| 81 | −0.41 | −0.65 | −1.06 |
| 122 | −0.26 | −0.58 | −0.91 |
| 239 | −0.10 | −0.31 | −0.59 |
| 356 | −0.04 | −0.01 | −0.041 |
| DFPL$_{average}$ | −0.16 | −0.39 | −0.64 |

For the gamma energy range from approximately 60 keV to approximately 356 keV, the standard scintillation crystal has a DFPL$_{average}$ of −0.64% and the furthest DFPL is −1.11% (absolute value of 1.11%) that occurs at 60 keV. For the same gamma energy range, the Zn-doped scintillation crystal has a DFPL$_{average}$ of −0.39% and the furthest DFPL is −0.73% (absolute value of 0.73%) that occurs at 60 keV. The Sr doped scintillation crystal has a DFPL$_{average}$ of −0.16% and the furthest DFPL is −0.47% (absolute value of 0.47%) that occurs at 60 keV. Accordingly, the Sr-doped scintillation crystal is significantly better and has less departure from perfect linearity as compared to each of the standard and Zn-doped scintillation crystals. The energy resolution ("ER") is obtained from the data collected using the samples and equipment as previously described. The energy resolution ratio ("ER Ratio) is, for a particular energy or range of energies, the ratio of the energy resolution of a particular sample divided by the energy resolution of another sample. Table 3 includes the energy resolution data for undoped, Sr-doped, and Zn-doped crystals, and Table 4 includes the energy resolution data for undoped, Ba-doped, and Mg-doped crystals.

TABLE 3

| Gamma-Ray Energy (keV) | ER of Sr-doped $La_{(1-y)}Ce_yBr_3$ (%) | ER of Zn-doped $La_{(1-y)}Ce_yBr_3$ (%) | ER of Undoped $La_{(1-y)}Ce_yBr_3$ (%) | ER Ratio (Sr/Zn) | ER Ratio (Sr/Std) | ER Ratio (Zn/Std) |
|---|---|---|---|---|---|---|
| 60 | 8.60 | 8.85 | 8.95 | 0.972 | 0.961 | 0.989 |
| 122 | 5.98 | 6.41 | 6.51 | 0.933 | 0.919 | 0.985 |
| 239 | 4.50 | 4.78 | 4.81 | 0.941 | 0.936 | 0.994 |
| 511 | 3.21 | 3.50 | 3.60 | 0.917 | 0.892 | 0.972 |
| 583 | 2.89 | 3.10 | 3.15 | 0.932 | 0.917 | 0.984 |
| 662 | 2.65 | 2.95 | 3.01 | 0.898 | 0.880 | 0.980 |
| 729 | 2.59 | 2.89 | 2.95 | 0.896 | 0.878 | 0.980 |
| 2615 | 1.61 | 1.92 | 2.01 | 0.839 | 0.801 | 0.960 |

Additional scintillation crystals were formed and evaluated for energy resolution at 662 keV. For two additional Sr-doped scintillation crystals, the energy resolution was 2.70% for both, and for 52 additional standard scintillation crystals, the energy resolution for the scintillation crystals was 3.02% with a standard deviation of 0.13%.

TABLE 4

| Gamma-Ray Energy (keV) | ER of Ba-doped $La_{(1-y)}Ce_yBr_3$ (%) | ER of Mg-doped $La_{(1-y)}Ce_yBr_3$ (%) | ER of Undoped $La_{(1-y)}Ce_yBr_3$ (%) | ER Ratio (Ba/Mg) | ER Ratio (Ba/Std) | ER Ratio (Mg/Std) |
|---|---|---|---|---|---|---|
| 662 | 2.68 | 2.70 | 3.01 | 0.898 | 0.880 | 0.980 |
| 2615 | 1.62 | 1.65 | 2.01 | 0.834 | 0.801 | 0.960 |

The data demonstrates that the Sr-doped and Ba-doped scintillation crystals have significantly improved energy resolution compared to the undoped, Mg-doped, and Zn-doped scintillation crystals. Thus, Sr, Ba, and any mixture of Sr and Ba are well suited as dopants to improve the energy resolution of rare earth halides.

Figure 4:
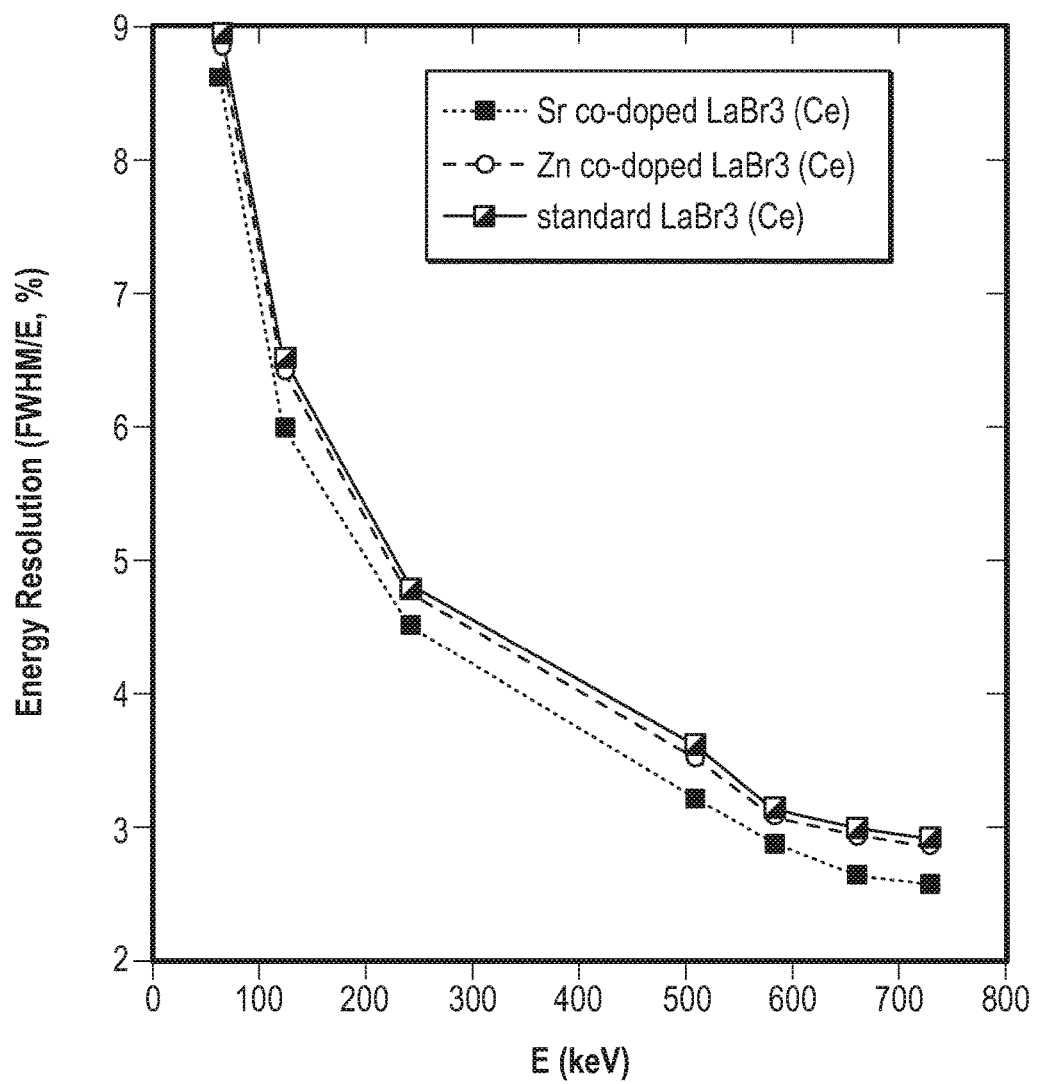
FIG. 4 includes a plot of energy resolution as a function of energy for a Sr-doped scintillation crystal, a Zn-doped scintillation crystal, and a standard scintillation crystal FIG. 5 includes a plot of energy resolution ratio as a function of energy for a Sr-doped scintillation crystal, a Zn-doped scintillation crystal, and a standard scintillation crystal FIG. 6 includes an emission spectrum for a Sr-doped scintillation crystal, a Zn-doped scintillation crystal, and a standard scintillation crystal.

FIG. 4 includes a plot of energy resolution as a function of energies in a range of 60 to 729 keV for the Sr-doped scintillation crystal, the Zn-doped scintillation crystal, and the standard scintillation crystal. The Sr-doped scintillation crystal clearly has superior energy resolution as compared to the Zn-doped and undoped scintillation crystals. The improvement in energy resolution for the Sr-doped scintillation crystal over the standard scintillation crystal is at least four times more than the difference between the Zn-doped scintillation crystal and the standard scintillation crystal. In particular, at 122 keV, the energy resolution of the Sr-doped scintillation crystal is 0.63% less than the energy resolution of the standard scintillation crystal, whereas, the energy resolution of the Zn-doped scintillation crystal is only 0.10% less than the energy resolution of the standard scintillation crystal. At 662 keV, the energy resolution of the Sr-doped scintillation crystal is 0.36% less than the energy resolution of the standard scintillation crystal, whereas, the energy resolution of the Zn-doped scintillation crystal is only 0.06% less than the energy resolution of the standard scintillation crystal. At 2615 keV, the energy resolution of the Sr-doped scintillation crystal is 0.40% less than the energy resolution of the standard scintillation crystal, whereas, the energy resolution of the Zn-doped scintillation crystal is only 0.09% less than the energy resolution of the standard scintillation crystal. At other energies, the Sr-doped scintillation crystal has a lower energy resolution as compared to the Zn-doped scintillation crystal and the standard scintillation crystal. The improved energy resolution means that a peak can be resolved more quickly and accurately, and can make the difference between detecting a peak and not detecting a peak, due to background noise.

Figure 5:
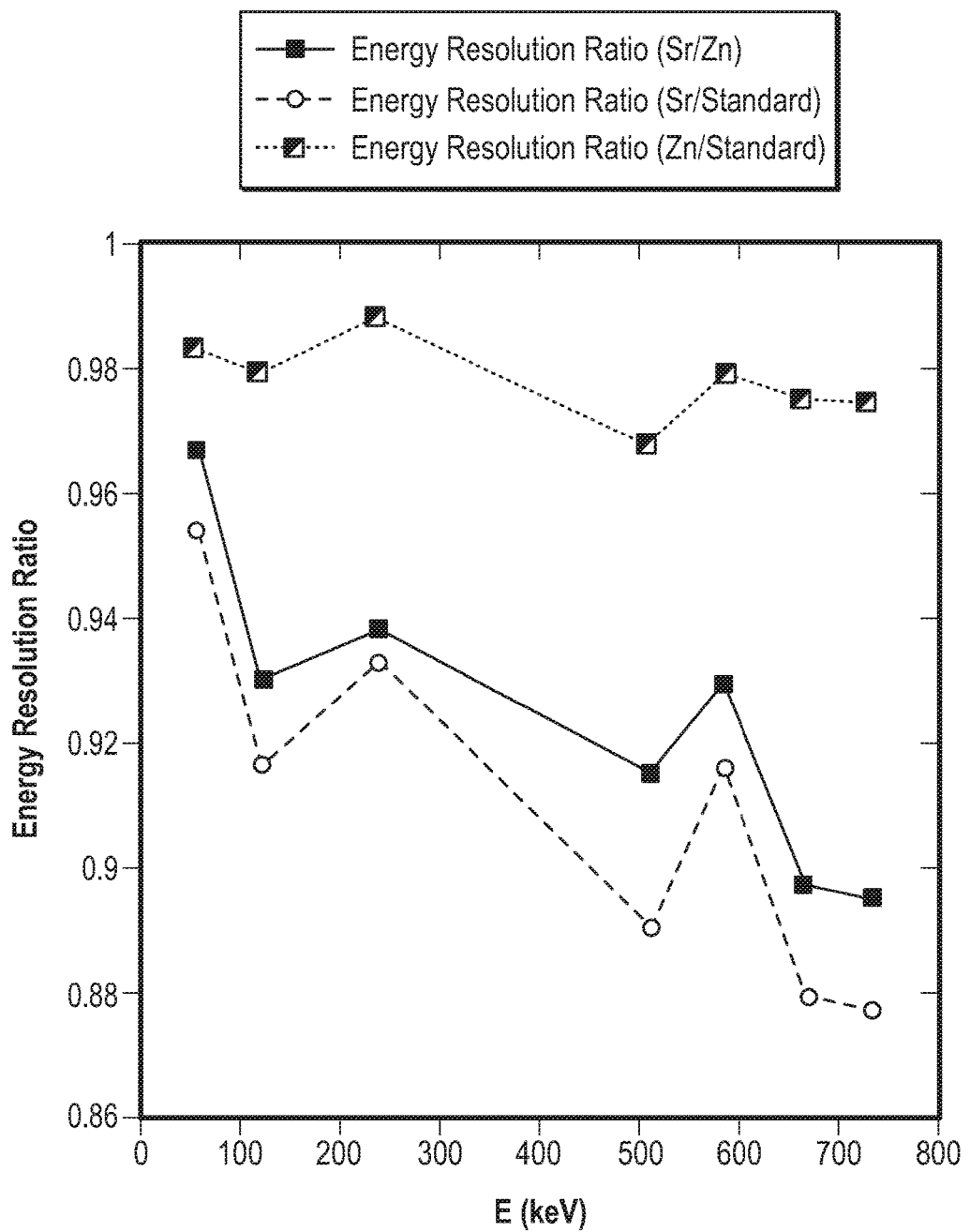

Table 3 and FIG. 5 include information related to the ER Ratios when comparing the Sr-doped scintillation crystal, the Zn-doped scintillation crystal, and the standard scintillation crystal. Particular comparisons are between the Sr-doped scintillation crystal and the Zn-doped scintillation crystal, Sr-doped scintillation crystal and the standard scintillation crystal, and the Zn-doped scintillation crystal and the standard scintillation crystal. When using an ER Ratio, a scintillation crystal of a particular type will have better energy resolution as compared to the other scintillation crystal. By using the ER Ratio, the comparison between two different scintillation crystals should have less dependence on the energy, as opposed to using only the energy resolution.

As can be seen in FIG. 5, the ER Ratio of the Sr-doped scintillation crystal is significantly better than the Zn-doped and standard scintillation crystals. The ER Ratio for Sr/Std is 0.961 at 60 keV, decreases to 0.878 at 729 keV, and is only 0.801 at 2615 keV. Unlike the Sr-doped scintillation crystal, the Zn-doped scintillation crystal is only slightly improved as compared to the standard doped scintillation crystal. The ER ratio for Zn/Std is nearly 1 at 239 keV and, for energies in a range of 60 to 729 keV, only reaches 0.972 at 511 keV. At even high energy, such at 2615 keV, the ER ratio for Zn/Std is reaches of low of 0.960.

Figure 6:
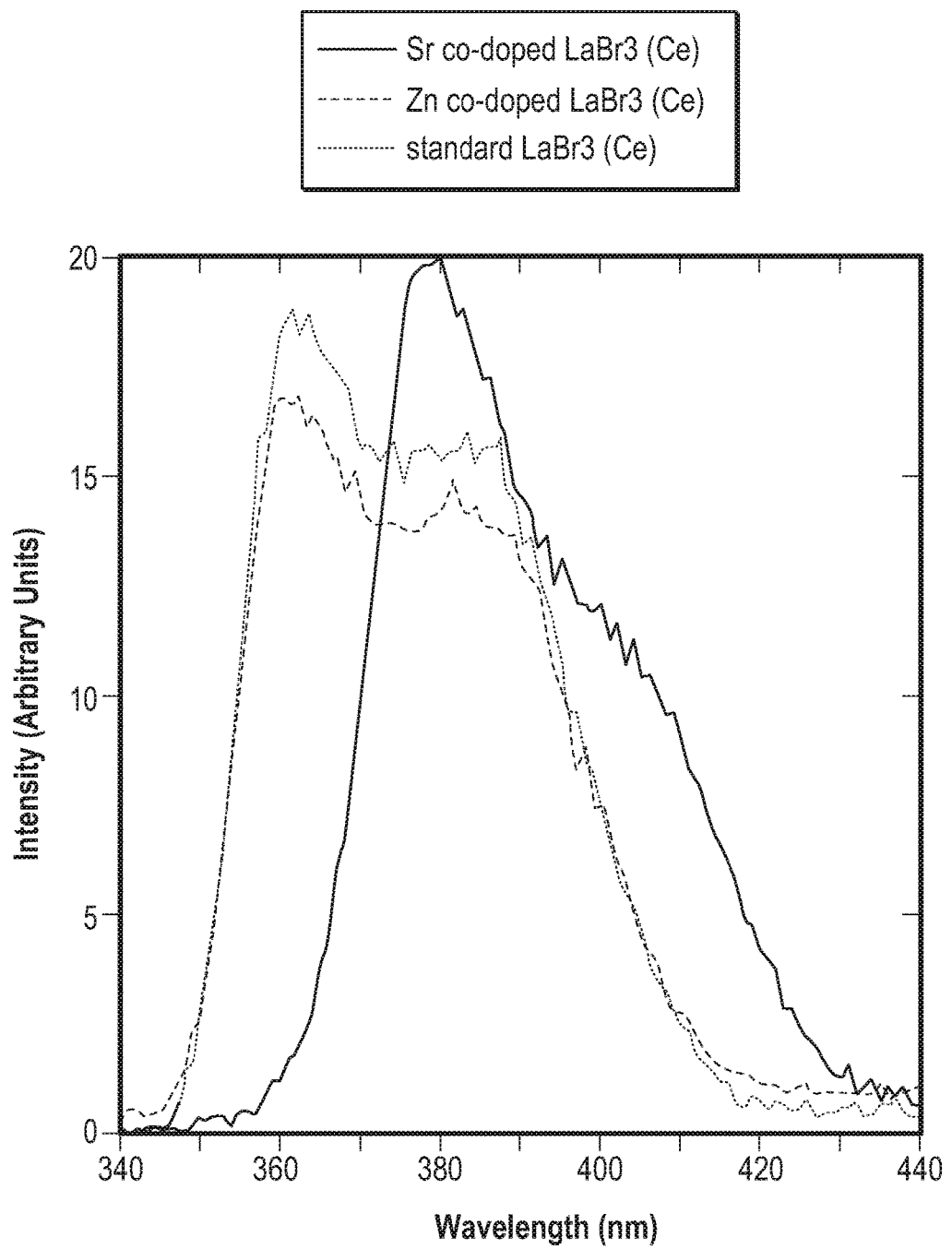

Data for emission spectra of the scintillation crystals were obtained and are illustrated in FIG. 6. The Sr-doped scintillation crystal has a peak emission intensity at a wavelength in a range of 375 to 380 nm and does not have a significant peak at a shorter wavelength. The Zn-doped and standard scintillation crystals have peak emission intensities at 350 to 360 nm. Many photosensors have higher quantum efficiencies for blue and green light, as compared to ultraviolet radiation. Thus, the Sr-doped scintillation crystal is better suited for many radiation detectors as compared to Zn-doped and standard scintillation crystals.

Note that not all of the activities described above in the general description or the examples are required, that a portion of a specific activity may not be required, and that one or more further activities may be performed in addition to those described. Still further, the order in which activities are listed is not necessarily the order in which they are performed.

Certain features that are, for clarity, described herein in the context of separate embodiments, may also be provided in combination in a single embodiment. Conversely, various features that are, for brevity, described in the context of a single embodiment, may also be provided separately or in any subcombination. Further, reference to values stated in ranges includes each and every value within that range.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

The specification and illustrations of the embodiments described herein are intended to provide a general understanding of the structure of the various embodiments. The specification and illustrations are not intended to serve as an exhaustive and comprehensive description of all of the elements and features of apparatus and systems that use the structures or methods described herein. Separate embodiments may also be provided in combination in a single embodiment, and conversely, various features that are, for brevity, described in the context of a single embodiment, may also be provided separately or in any subcombination. Further, reference to values stated in ranges includes each and every value within that range. Many other embodiments may be apparent to skilled artisans only after reading this specification. Other embodiments may be used and derived from the disclosure, such that a structural substitution, logical substitution, or another change may be made without departing from the scope of the disclosure. Accordingly, the disclosure is to be regarded as illustrative rather than restrictive.

What is claimed is:

1. A well logging apparatus comprising:
    a scintillation crystal including $La_{(1-y)}RE_yX_3:Me^{2+}$, wherein:
       RE represents a rare earth element other than La;
       y has a value in a range of 0 to 1;
       X represents a halogen; and
       $Me^{2+}$ represents Sr, Ba, or any mixture thereof; and
    wherein the scintillation crystal has a property including:
    for a radiation energy range of 60 keV to 356 keV, the scintillation crystal has an average value for a departure from perfect linearity of no less than −0.35%;
    for a radiation energy range of 2000 keV to 2600 keV, the scintillation crystal has an average value for a departure from perfect linearity of no greater than 0.07%;
    for a radiation energy range of 60 keV to 356 keV, the scintillation crystal has an absolute value for a furthest departure from perfect linearity of no greater than 0.7%; or
    any combination thereof.

2. The well logging apparatus of claim 1, wherein the average value for the departure from perfect linearity ($DFPL_{average}$) is determined by:

$$DFPL_{average} = \frac{\int_{E_{lower}}^{E_{upper}} DFPL(E_i) \cdot dE_i}{E_{upper} - E_{lower}},$$

where
   $DFPL(Ei)$ is DFPL at energy $E_i$;
   $E_{upper}$ is the upper limit of the energy range; and
   $E_{lower}$ is the lower limit of the energy range.

3. The well logging apparatus of claim 1, wherein the concentration of $Me^{2+}$ is no greater than 0.03 wt. %.

4. The well logging apparatus of claim 1, wherein the concentration of $Me^{2+}$ is in a range of 0.005 wt. % to 0.02 wt. %.

5. The well logging apparatus of claim 1, wherein y has a value in a range of 0.001 to 0.5.

6. The well logging apparatus of claim 1, wherein RE is Ce.

7. The well logging apparatus of claim 1, wherein X is Br.

8. A medical imaging apparatus comprising:
    a scintillation crystal including $La_{(1-y)}RE_yX_3:Me^{2+}$, wherein:
       RE represents a rare earth element other than La;
       y has a value in a range of 0 to 1;
       X represents a halogen; and
       $Me^{2+}$ represents Sr, Ba, or any mixture thereof and has a concentration in a range of 0.0002 wt. % to 0.05 wt. %;
    a photosensor optically coupled to the scintillation crystal; and
    an electronics module coupled to the photosensor.

9. The medical imaging apparatus of claim 8, wherein the electronics module comprises an amplifier, a pre-amplifier, a discriminator, an analog-to-digital signal converter, a photon counter, another electronic component, or any combination thereof.

10. The medical imaging apparatus of claim 8, wherein the scintillation crystal has a property including:
    for a radiation energy range of 60 keV to 356 keV, the scintillation crystal has an average value for a departure from perfect linearity of no less than −0.35%;
    for a radiation energy range of 2000 keV to 2600 keV, the scintillation crystal has an average value for a departure from perfect linearity of no greater than 0.07%;
    for a radiation energy range of 60 keV to 356 keV, the scintillation crystal has an absolute value for a furthest departure from perfect linearity of no greater than 0.7%; or
    any combination thereof.

11. The medical imaging apparatus of claim 10, wherein the average value for the departure from perfect linearity ($DFPL_{average}$) is determined by:

$$DFPL_{average} = \frac{\int_{E_{lower}}^{E_{upper}} DFPL(E_i) \cdot dE_i}{E_{upper} - E_{lower}},$$

where
   $DFPL(Ei)$ is DFPL at energy $E_i$;
   $E_{upper}$ is the upper limit of the energy range; and
   $E_{lower}$ is the lower limit of the energy range.

12. The medical imaging apparatus of claim 8, wherein RE is Ce, and X is Br.

13. The medical imaging apparatus of claim 8, wherein the medical imaging device is a positron emission tomography apparatus.

14. The medical imaging apparatus of claim 8, wherein the medical imaging device is a single positron emission computer tomography apparatus.

15. The medical imaging device of claim 8, wherein y has a value in a range of 0.001 to 0.5.

16. A security inspection apparatus comprising:
a scintillation crystal including $La_{(1-y)}RE_yX_3:Me^{2+}$, wherein:
RE represents a rare earth element other than La;
y has a value in a range of 0 to 1;
X represents a halogen; and
$Me^{2+}$ represents Sr, Ba, or any mixture thereof and has a concentration in a range of 0.0002 wt. % to 0.05 wt. %.

17. The security inspection apparatus of claim 16, wherein the concentration of $Me^{2+}$ is no greater than 0.03 wt. %.

18. The security inspection apparatus of claim 16, wherein the concentration of $Me^{2+}$ is in a range of 0.005 wt. % to 0.02 wt. %.

19. The security inspection apparatus of claim 16, wherein y has a value in a range of 0.001 to 0.5.

\* \* \* \* \*

UNITED STATES PATENT AND TRADEMARK OFFICE
CERTIFICATE OF CORRECTION

PATENT NO. : 10,442,989 B2  
APPLICATION NO. : 16/043374  
DATED : October 15, 2019  
INVENTOR(S) : Peter R. Menge et al.

Page 1 of 1

It is certified that error appears in the above-identified patent and that said Letters Patent is hereby corrected as shown below:

On the Title Page

In Column 2, Item (56), Other Publications, page 2, Line 12, please delete "Waiter" and insert --Wafter--

In Column 2, Item (56), Other Publications, page 2, Line 16, please delete "Modem" and insert --Modern--

In Column 1, Item (56), Other Publications, page 3, Line 2, please delete "3a2+" and insert --Ba2+--

In the Claims

In Column 17, Line 40, please delete "$La_{(i-y)}RE_yX_3:Me^{2+}$," and insert --$La_{(1-y)}RE_yX_3:Me^{2+}$,--

Signed and Sealed this  
Twenty-third Day of November, 2021

Drew Hirshfeld  
*Performing the Functions and Duties of the*  
*Under Secretary of Commerce for Intellectual Property and*  
*Director of the United States Patent and Trademark Office*